United States Patent
Herner

(10) Patent No.: US 9,419,185 B2
(45) Date of Patent: Aug. 16, 2016

(54) METHOD OF SINGULATING LED WAFER SUBSTRATES INTO DICE WITH LED DEVICE WITH BRAGG REFLECTOR

(71) Applicant: GLO AB, Lund (SE)

(72) Inventor: Scott Brad Herner, San Jose, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/605,200

(22) Filed: Jan. 26, 2015

(65) Prior Publication Data

US 2015/0214439 A1    Jul. 30, 2015

Related U.S. Application Data

(60) Provisional application No. 61/931,906, filed on Jan. 27, 2014, provisional application No. 61/931,925, filed on Jan. 27, 2014.

(51) Int. Cl.
*H01L 33/00* (2010.01)
*H01L 33/46* (2010.01)
*H01L 33/18* (2010.01)
*H01L 33/32* (2010.01)
*H01L 33/08* (2010.01)

(52) U.S. Cl.
CPC ............. *H01L 33/46* (2013.01); *H01L 33/007* (2013.01); *H01L 33/0095* (2013.01); *H01L 33/18* (2013.01); *H01L 33/08* (2013.01); *H01L 33/32* (2013.01); *H01L 2933/0025* (2013.01)

(58) Field of Classification Search
CPC ..... H01L 33/46; H01L 33/0075; H01L 33/06; H01L 33/0066; H01L 33/32; H01L 33/08; H01L 33/12; H01L 2933/0033; H01L 2933/0025; H01L 2933/0075
See application file for complete search history.

(56) References Cited

U.S. PATENT DOCUMENTS

| | | | |
|---|---|---|---|
| 6,784,462 B2 | 8/2004 | Schubert |
| 7,812,421 B2 | 10/2010 | Chua et al. |
| 7,863,599 B2 | 1/2011 | Kim et al. |
| 7,897,992 B2 | 3/2011 | Shum et al. |
| 7,915,629 B2 | 3/2011 | Li et al. |
| 7,982,207 B2 | 7/2011 | Kim et al. |

(Continued)

FOREIGN PATENT DOCUMENTS

| | | |
|---|---|---|
| CN | 102500933 A | 6/2012 |
| JP | 2005-005604 A | 1/2005 |
| WO | WO 2013-033152 A1 | 3/2013 |

OTHER PUBLICATIONS

International Search Report and Written Opinion received in connection with international application No. PCT/US2015/012834, issued Apr. 29, 2015.

*Primary Examiner* — Nikolay Yushin
(74) *Attorney, Agent, or Firm* — The Marbury Law Group PLLC

(57) ABSTRACT

A method of dicing semiconductor devices from a substrate includes forming a Bragg reflector over a bottom side of the substrate, where the bottom side is opposite of a top side, generating a pattern of defects in the substrate with a laser beam from the bottom side of the substrate, and applying pressure to the substrate to dice the substrate along the pattern of defects. The Bragg reflector includes a first layer of dielectric material having a first index of refraction and a second dielectric material having a second index of refraction different from the first index of refraction.

6 Claims, 10 Drawing Sheets

(56) References Cited

U.S. PATENT DOCUMENTS

| | | |
|---|---|---|
| 8,124,433 B2 | 2/2012 | Shum et al. |
| 8,450,758 B2 | 5/2013 | Liu et al. |
| 8,575,633 B2 | 11/2013 | Donofrio et al. |
| 8,598,609 B2 | 12/2013 | Ibbetson et al. |
| 8,680,556 B2 | 3/2014 | Ibbetson et al. |
| 8,710,536 B2 | 4/2014 | Ibbetson et al. |
| 2011/0272724 A1 | 11/2011 | Tsai et al. |
| 2012/0067858 A1 | 3/2012 | Kangastupa et al. |
| 2015/0064815 A1 | 3/2015 | Harvey et al. |
| 2015/0085524 A1 | 3/2015 | Wang et al. |

METHOD OF SINGULATING LED WAFER SUBSTRATES INTO DICE WITH LED DEVICE WITH BRAGG REFLECTOR

FIELD

The embodiments of the invention are directed generally to light emitting diodes (LED), and specifically to nanowire LEDs which incorporate a backside reflective layer called a distributed Bragg reflector, or DBR. Additionally, embodiments of the invention includes methods to singulate a wafer with an LED layer on one side and a DBR layer on the opposite side of the substrate into dice. The method uses a laser to incorporate defects into the wafer and followed by breaking the wafer by mechanical force.

BACKGROUND

LEDs are used in electronic displays, such as liquid crystal displays in laptops or LED televisions. Conventional LED units are fabricated by mounting LED dice to a substrate, encapsulating the mounted LEDs and then optically coupling the encapsulated LEDs to an optical waveguide.

SUMMARY

One embodiment provides a method of dicing semiconductor devices from a substrate includes forming a Bragg reflector over a bottom side of the substrate, where the bottom side is opposite of a top side, generating a pattern of defects in the substrate with a laser beam from the bottom side of the substrate, and applying pressure to the substrate to dice the substrate along the pattern of defects. The Bragg reflector includes a first layer of dielectric material having a first index of refraction and a second dielectric material having a second index of refraction different from the first index of refraction.

Another embodiment provides a light emitting diode (LED) die comprising a substrate, a plurality of LED layers located over a top side of the substrate, and a Bragg reflector located over a bottom side of the substrate, wherein the Bragg reflector comprises a first layer of dielectric material having a first index of refraction and a second dielectric material having a second index of refraction different from the first index of refraction.

BRIEF DESCRIPTION OF THE DRAWINGS

FIGS. 1A-1B are side schematic illustrations of nanowire LED (A) with and (B) without a reflecting layer on the opposite side of the LED layer, with a wafer substrate in between.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Embodiments of the invention include nanowire-based semiconductor devices, such as nanowire LEDs, and methods of fabricating nanowire LEDs with DBR layers, and methods to singulate nanowire LED substrates with DBR layers. Nanowire LEDs, such as GaN nanowire LEDs, show promise in increasing the efficiency and wavelength stability compared to conventional planar LEDs. Despite this promise, improvements in the light extraction efficiency are desirable. The inventor has developed a backside reflector layer that increases the extraction efficiency of nanowire LED devices. Additionally, the inventor has developed methods to singulate wafer substrates with LEDs layers on one side and reflective layers on the opposite side using a laser technique that yields a high number of die per wafer.

Figure 1A:
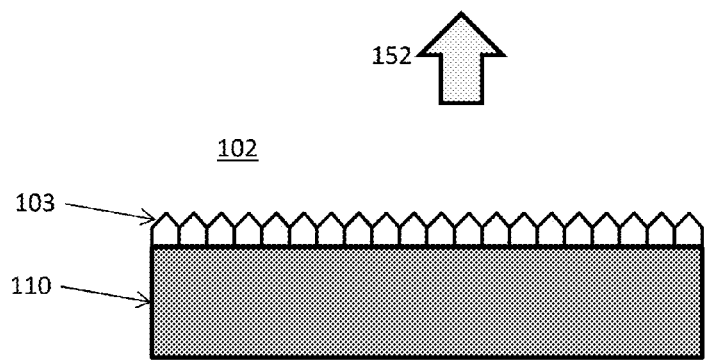

The present inventor realized that a DBR has several advantages over metal reflectors in LED applications. First, dielectric layers of the DBR adhere to substrates, such as sapphire wafers, much better than metal layers. Silver has especially poor adhesive properties to sapphire and thin silver layers can be removed from sapphire with simple mechanical abrasion. Thus, a DBR adheres better to a sapphire substrate than a silver reflective layer. FIG. 1A illustrates a an LED die 102 with LED layers 103 on a substrate 110 without a back side reflective layer. The light emitting device of FIG. 1A is top emitting. That is, the light 152 is generally emitted in a direction away from the substrate 110 as indicated by the arrow. However, some of the light emitted by the LED layers 103 is emitted downward into the substrate and it therefore lost.

Figure 1B:
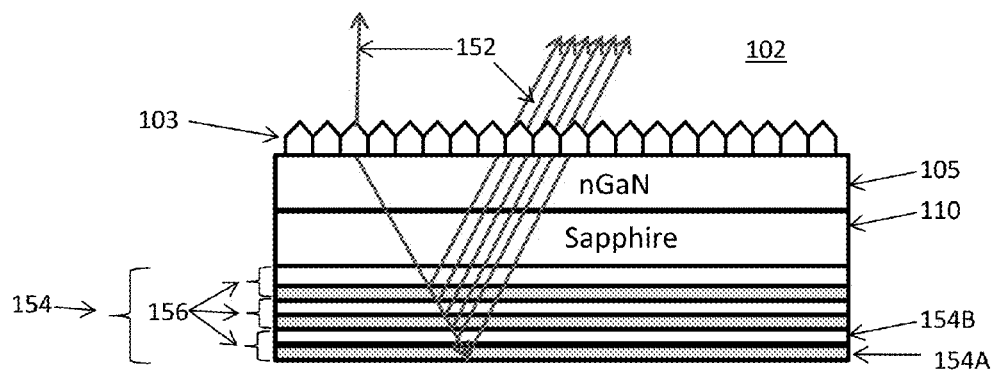

As shown in FIG. 1B, in one embodiment, the LED layers 103 are III-nitride nanowire based LED layers, such as GaN nanowire core surrounded by one or more InGaN and GaN shells forming a p-n or p-i-n junction sandwiching a quantum well active region. The LED layers 103 are located over GaN buffer layer 105 located on the top (e.g., front) side of a sapphire substrate 110.

A Bragg reflector, such as a distributed Bragg reflector ("DBR") 154 may be located on the bottom (e.g., back) side of the substrate 110. The back side DBR 154 increases the light 152 emitted from the LED layers 103 by reflecting the downward emitted light back towards the top of the device through the substrate 110. The distributed Bragg reflector 154 includes pairs 156 of dielectric layers 154A, 154B, with each dielectric layer 154A, 154B having a different index of refraction and each layer being transparent to light emitted by the LED layers 103 (e.g., visible light). In an embodiment, the addition of the Bragg reflector 154 results in enhanced light output in the direction normal to the plane of the substrate 110 in a LED die which includes nanowires in the LED layers 103 on one (e.g., top) side of the substrate 110. In the embodiment illustrated in FIG. 1B, the substrate 110 includes a distributed Bragg reflector which includes multiple pairs 156 of dielectric layers 154A, 154B, such as 2 or more pairs, such as 6 pairs of dielectric layers 154A, 154B. Suitable dielectric materials for the Bragg reflector 154 include $TiO_2/SiO_2$ layers. Other dielectric materials that may be used include silicon nitride (e.g., $Si_3N_4$), $Ta_2O_5$, $HfO_2$, $Al_2O_3$, $ZrO_2$, and ZnO.

For each layer in the DBR 154, the thickness of the layers may be chosen for maximum reflection at one wavelength according to the formula $t=\lambda/4n$, where $\lambda$ is the wavelength that is desired to be reflected and n is the index of refraction of the material. For example, to maximize reflection at 510 nm (green light), one may choose a $SiO_2$ layer 154B thickness of t=510 nm/4*(1.46)=87 nm and a $TiO_2$ layer 154A thickness of t=510 nm/4*(about 2.2 to 2.9)=about 47 nm for n=2.6. Different crystalline forms of $TiO_2$ will have different indexes of refraction ranging between 2.2 and 2.9. The DBR also highly reflects a range of wavelengths of about 50 nm above and below the selected peak wavelength. There may be tradeoffs in achieving a high index of refraction. For example, there may be decreased transmission which may negatively impact reflectivity of the DBR. Materials for DBRs are typically chosen to have the highest transmission (smallest absorption) in the desired reflected wavelength, and the highest index of refraction in the desired reflected wavelength. The index of refraction can change with wavelength. Other materials may be used for Bragg reflectors in the wavelengths of 440 to 530 nm for visible light LEDs, such as silicon nitride and aluminum oxide.

The dielectric layers can be deposited by any known method including evaporation, sputtering, and chemical vapor deposition (CVD). Most preferably they are deposited by evaporation with some oxygen flow during deposition to maintain material stoichiometry, transmissivity, and insulating nature of the layers. It is also desirable to deposit the layers on the backside only of the wafers, and not deposit on the front side.

In an embodiment, for a green emitting LED die 102, the thickness of the $TiO_2/SiO_2$ layers 154A, 154B may be designed to reflect most light in a wavelength range between 480 and 550 nm. The thickness of the dielectric layers 154A, 154B may range from 550 to 600 Å and from 770 to 820 Å, respectively, for a green emitting LED die 102. The thicknesses may be adjusted to optimize the reflectance for other color (e.g., blue or red) emitting LED die.

In general, reflectivity increases with more pairs 156 of dielectric layers 154A, 154B. However, in general, the increase is minimal for more than 6 pairs. For example, 1 pair of $TiO_2/SiO_2$ layers may reflect 40% of light while 6 pairs reflect greater than 90% of light in the above wavelength range.

Figure 2:
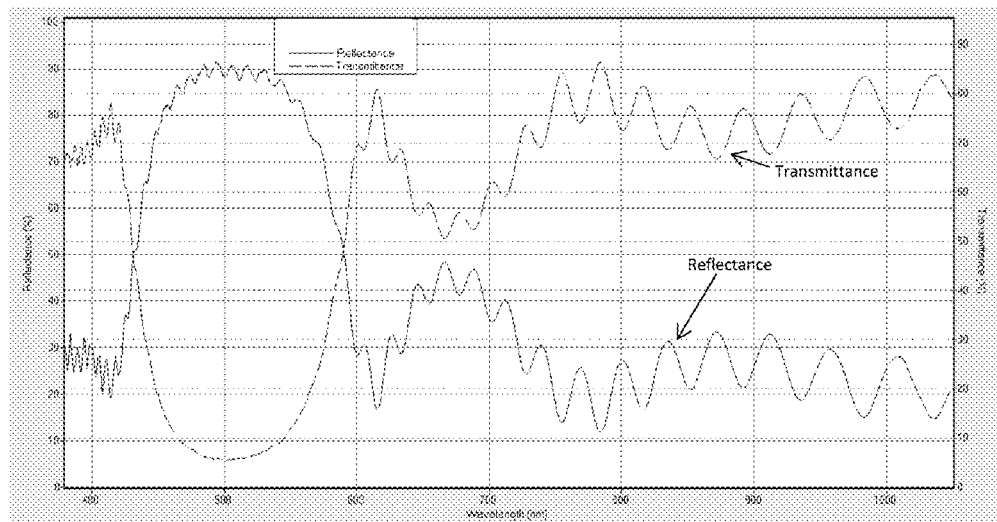
FIG. 2 is a plot of the reflectance and transmittance as a function of wavelength for a device with a back side DBR according to an embodiment.
Figure 3:
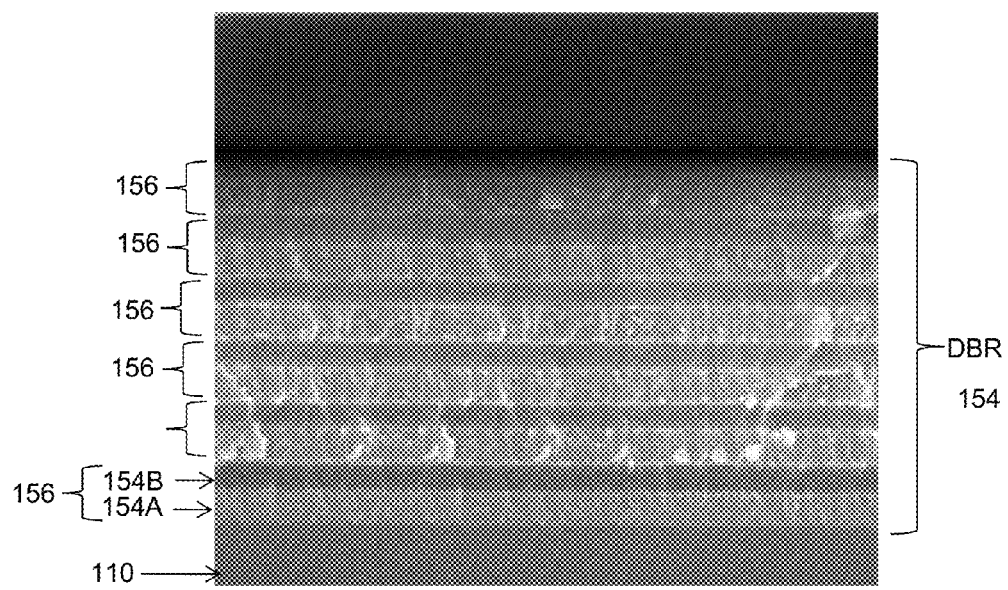
FIG. 3 is an SEM micrograph of a backside DBR according to the embodiment.

In an example, a DBR 154 with 6 pairs 156 of $SiO_2/TiO_2$ dielectric layers 154A, 154B are deposited on the back side of a smooth substrate 110 (e.g., sapphire wafer) with a 4 micron GaN layer 105 located on the front side of the substrate 110. The reflectance and transmittance as a function of wavelength for the DBR 154 are shown in FIG. 2. As can be seen in FIG. 2, the DBR 154 is highly reflective for light with wavelengths between 480 and 530 nm, but highly transmissive for IR radiation with wavelengths above 750 nm. FIG. 3 illustrates a cross sectional SEM micrograph of this device. The micrograph illustrates the alternating layers of $TiO_2$ 154A and $SiO_2$ 154B. The thickness of the $TiO_2$ and $SiO_2$ layers 154A, 154B is designed to be around 580 Å and 780 Å, respectively.

Figure 4:
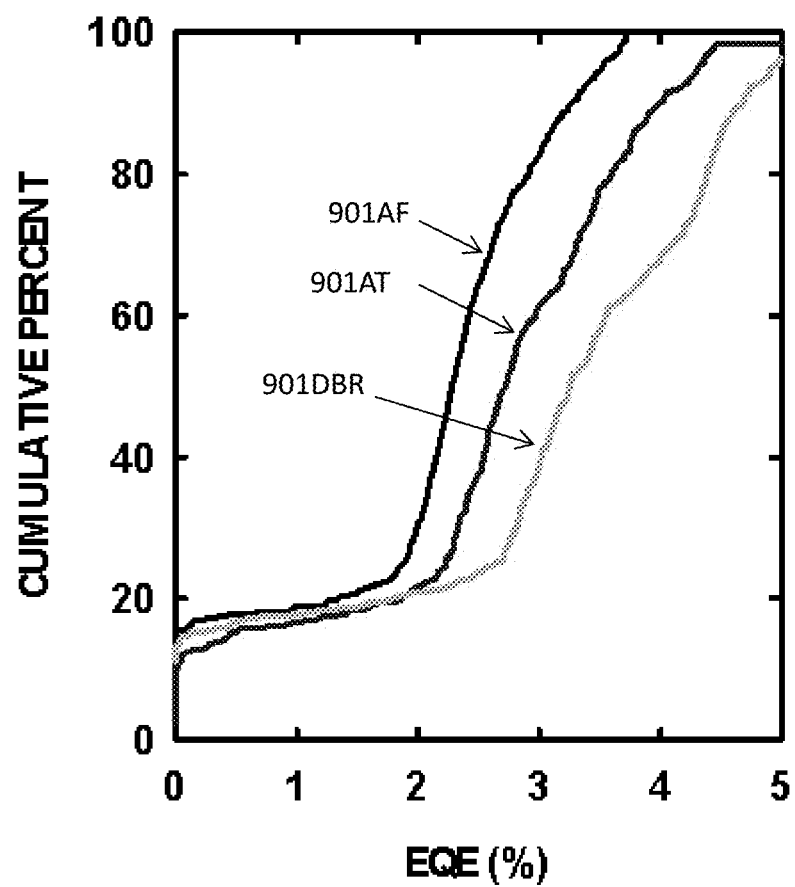
FIG. 4 is a plot of the light output as measured by external quantum efficiency of a wafer with coalesced nanowires emitting green light.

FIG. 4 is a probability plot of the light output as measured by external quantum efficiency (EQE) of a wafer/substrate 110 with coalesced nanowires emitting green light in the LED layer 103 (~510 nm peak wavelength) of several hundred LED dice 102. The EQE of the LED devices after fabrication is shown by line 901AF. The wafer/substrate 110 is then thinned from a thickness of 480 µm to a thickness of 120 µm. The EQE of the LED devices after substrate thinning is shown by line 901AT. Then, a DBR 154 is deposited on the back side of the wafer/substrate 110. The EQE of the LED devices after the DBR formation is shown by line 901DBR. The wafer/substrate 110 includes 350 LED devices. The median of the EQE of the several hundred die increased by about 20% when a DBR is deposited on the back side of the wafer/substrate 110.

In some cases, mechanical dicing methods may be replaced by laser assisted dicing. For example, laser scribing by introduction of defects internal to the wafer (not by laser ablation) reduces breakage and allows for narrower dicing streets. This ultimately increases the number of dice per wafer.

Figure 5A:
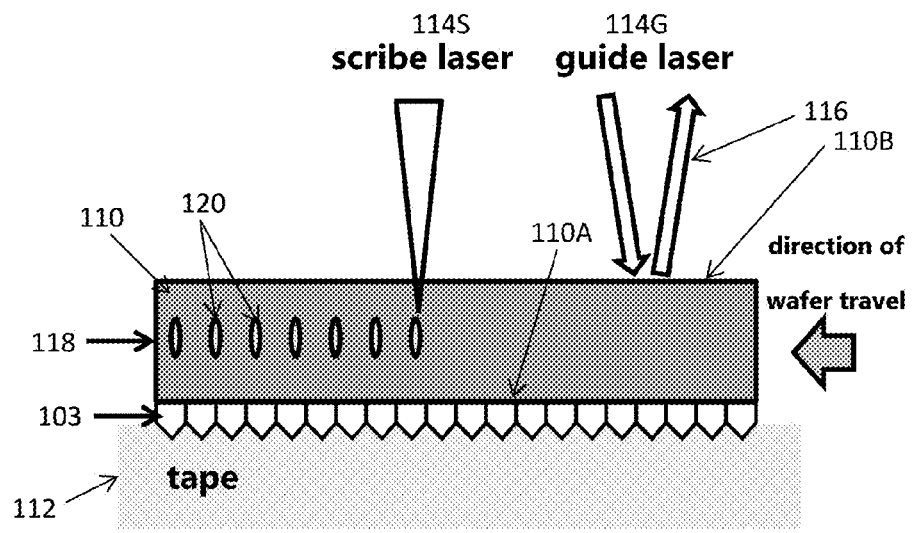
FIGS. 5A-C are a schematic illustrations of a plan view steps of a method of singulating LED dice.
Figure 5B:
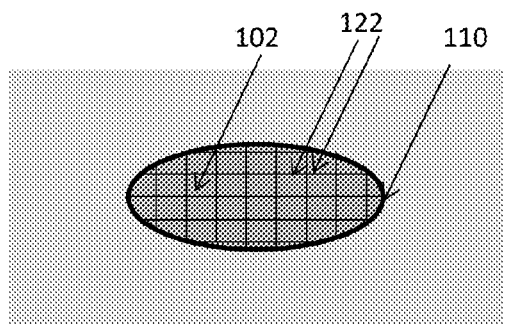
Figure 5C:
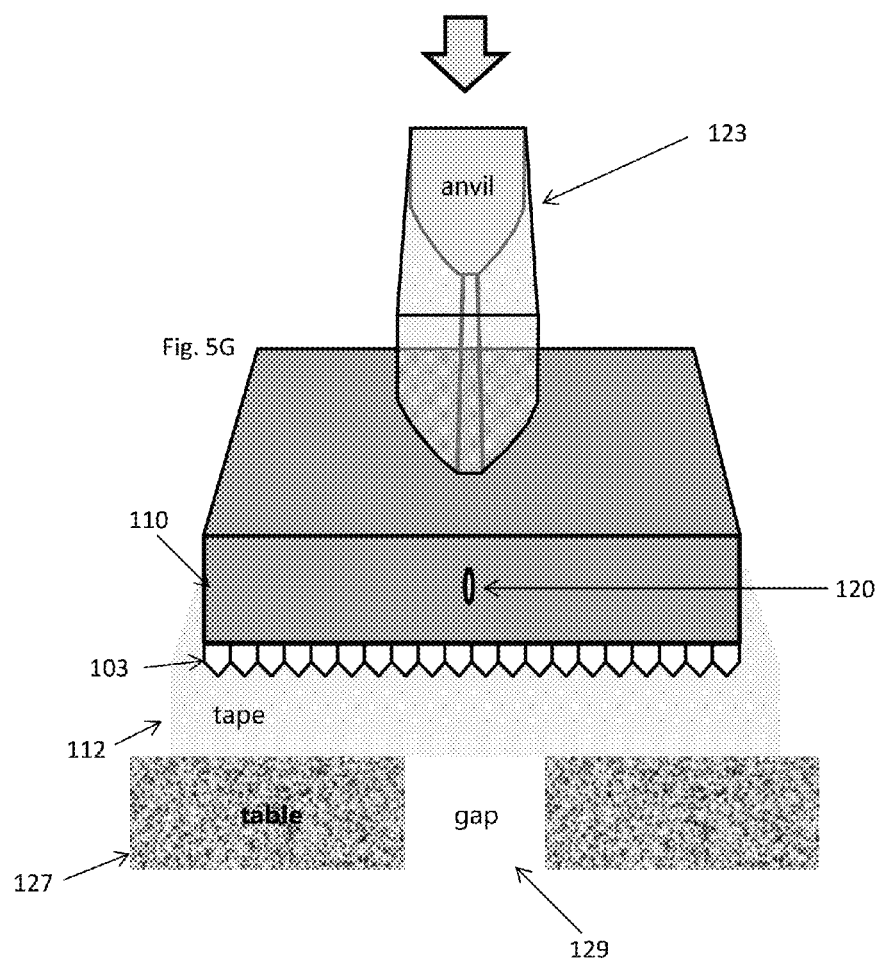

A laser defect generation and dicing technique is known as stealth scribing. The stealth scribing process is illustrated in FIGS. 5A-C. The semiconductor device layers, such as LED layers 103, are formed on the top side 110A of substrate 110, as shown in FIG. 5A. As illustrated in FIG. 5A, the wafer 110 is mounted on a tape 112, the front side (e.g., the top device side) 110A down. The smooth bottom side 110B of the wafer 110 is exposed.

Stealth scribing involves a laser focused to an interior point in a wafer 110, resulting in a pattern defects 120 at the point of focus of the laser, as shown in FIG. 5A. As illustrated in FIG. 5A, two lasers, a guide laser 114G and a scribe laser 114S are typically used. The guide laser 114G measures the vertical height of the wafer 110 by reflecting light 116 off the smooth back surface 110B of the wafer 110. This measurement is fed back to the scribing laser 114S, which follows the guide laser 114G and focuses its energy at a consistent plane 118 inside the wafer 110. Preferably, the substrate is transparent to the scribing laser 114S. In an embodiment, the substrate is sapphire and the scribing laser 114S operates at a wavelength of approximately 532 nm.

The scribe laser 114S is rastered around the wafer 110 in x-y locations, writing the shape of the LED dice 102 shown in FIG. 5B by placing defects 120 along the lines where the LED dies 102 will be broken. After laser "scribing" (i.e., writing) a pattern of defects 120 into the wafer 110, there is a pattern 122 of defects 120 within the wafer 110, but the wafer 110 is still whole. The defects 120 are typically not be visible to naked eye on the wafer 110.

As illustrated in FIG. 5C, the LED dies 102 are singulated from the wafer by pressing on the back of the wafer 110 with an anvil 123. Preferably, the wafer is located on a table 127 or other suitable surface having a gap 129 opposite the anvil 123.

Figure 6:
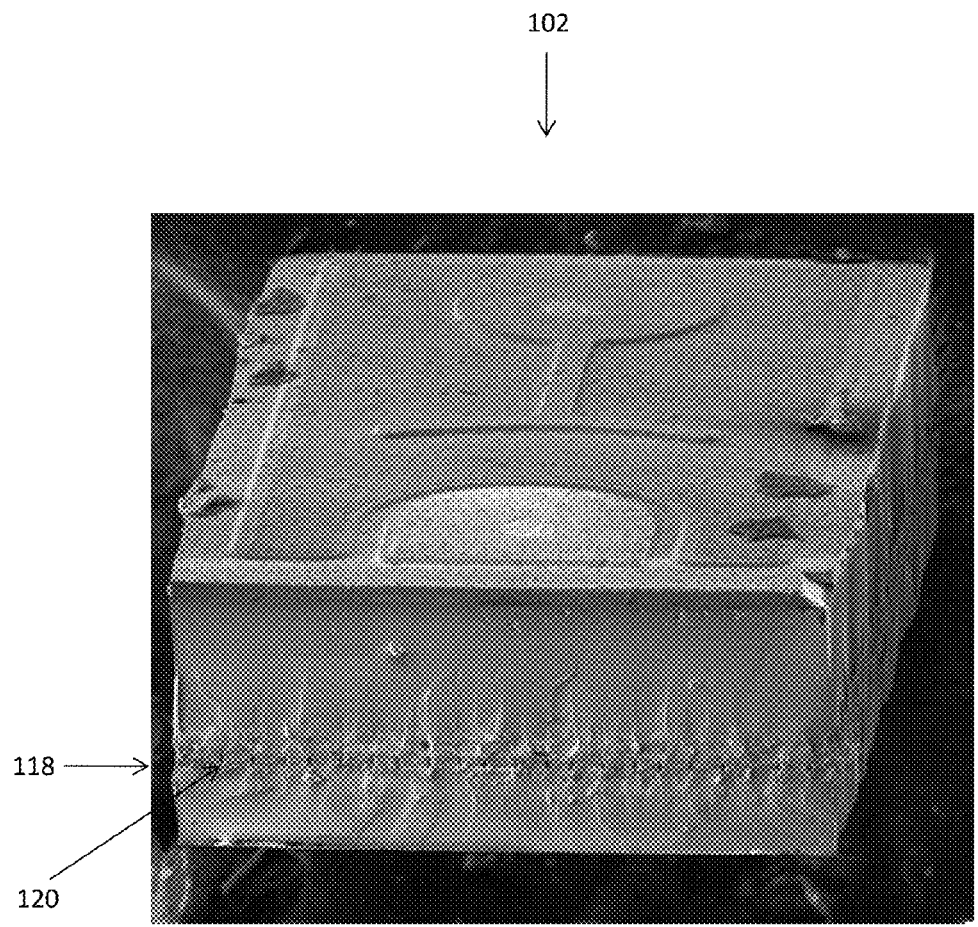
FIG. 6 is an SEM micrograph of an LED die that has been singulated by stealth scribing and mechanical force.

FIG. 6 is a photograph of a singulated die made according to the above method. The plane 118 of defects 120 is clearly visible in the photograph. Thus, the laser damaged region comprises a band of laser created defects 120 which is located on the side (i.e., edge) surface of the LED die.

Thus, as described above, stealth scribing involves the application of internal defects to a wafer by laser focusing, and then anvil breaking the wafer along the lines of defects.

Additionally, the present inventor realized that DBRs can be designed to be reflective (i.e., not transparent, such as having a transmittance below 20% and/or reflectance above 70%) in only a small wavelength band while being transparent (i.e., transmissive, such as having a transmittance above 65% and/or reflectance below 35%) to other wavelengths. This is particularly useful for singulation by laser defect generation in the substrate followed by application of pressure or mechanical force, such as stealth scribing or another laser based singulation method, as described above. For example, the back side distributed Bragg reflector 154 can be transparent in a wavelength range typically used in the laser singulation method, and reflective in the LED die 102 peak emission wavelength. This allows the DBR 154 to reflect the light 152 emitted by the LED layers 103 through the top of the LED die while still allowing the laser beam to be transmitted through the DBR 154 into the back side of substrate 110 to generate defects during the laser singulation process. For example, the DBR may be transparent in the typical defect generation laser peak wavelength in the infrared (IR) wavelength range between 800 and 1200 nm, such as a 1064 nm peak wavelength, while being reflective to the LED peak emission wavelength, such as a visible light range (e.g., 400 to 700 nm) and/or UV radiation range (e.g., 250 to 400 nm). In the example in FIG. 2, the DBR layer is highly reflective in the range 450 to 550 nm wavelengths, and more transmissive for wavelengths greater than 700 nm.

In contrast, reflective back side metal layers 150, such as silver, are reflective (i.e., not transparent, such as having a transmittance below 20% and/or reflectance above 70%) to all laser scribing wavelengths (e.g. 356 nm wavelengths and greater). This makes singulation by back side laser defect generation through the metal layer impossible when the back side metal layer is present.

Figure 7A:
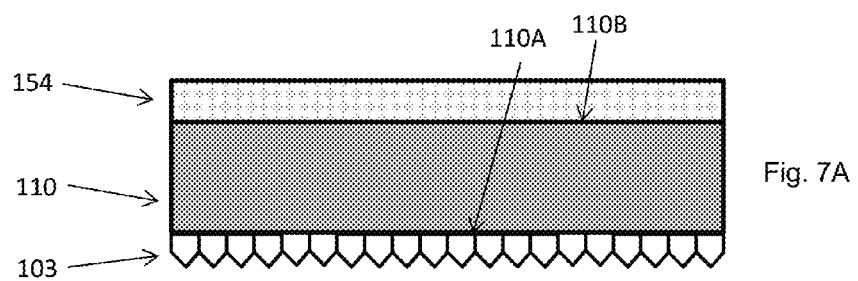
FIGS. 7A-B is a side schematic diagram of one method to incorporate defects by laser in a wafer with an intact DBR layer that will be singulated by mechanical force.
Figure 7B:
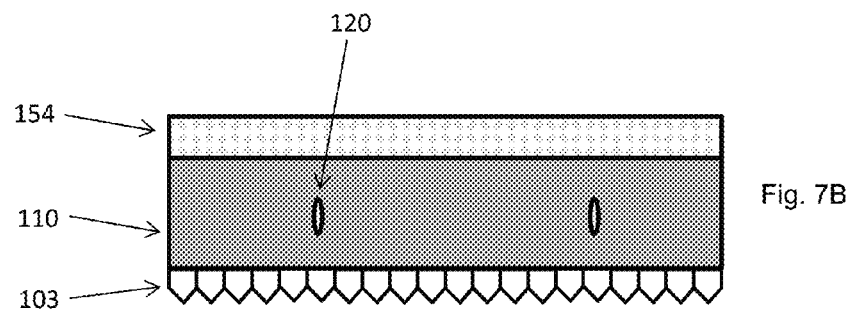

A method of dicing semiconductor devices is shown in FIGS. 7A-B. A substrate 110 according to an embodiment includes depositing a Bragg reflector 154 (e.g., a DBR) on a bottom side 110B of the substrate 110 opposite of a top side 110A. The Bragg reflector 154 includes a first dielectric layer 154A (a layer of dielectric material) having a first index of refraction and a second dielectric layer 154B having a second index of refraction. The method also includes generating a pattern of defects 120 in the substrate 110 with a laser beam through the Bragg reflector 154, as shown in FIG. 7B. Next, mechanical pressure is applied to the substrate to singulate the substrate along the pattern of defects into individual die.

Figure 8A:
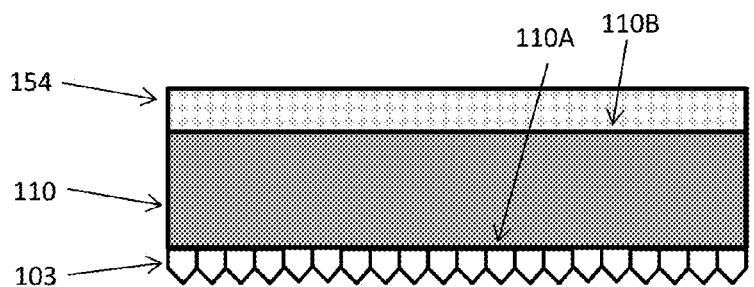
FIGS. 8A-C are a side schematic diagram of another method to incorporate defects by laser in a wafer with a DBR that has been selectively removed that will be singulated by mechanical force.
Figure 8B:
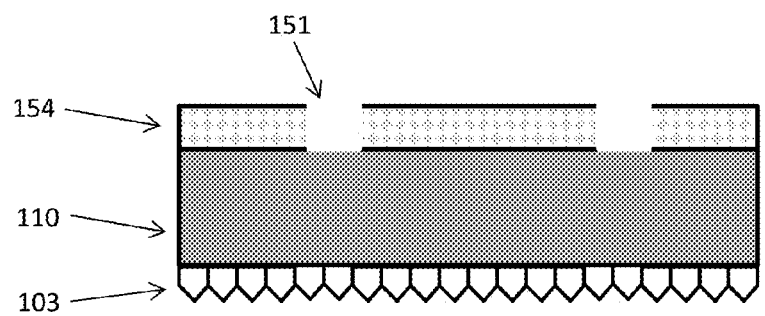
Figure 8C:
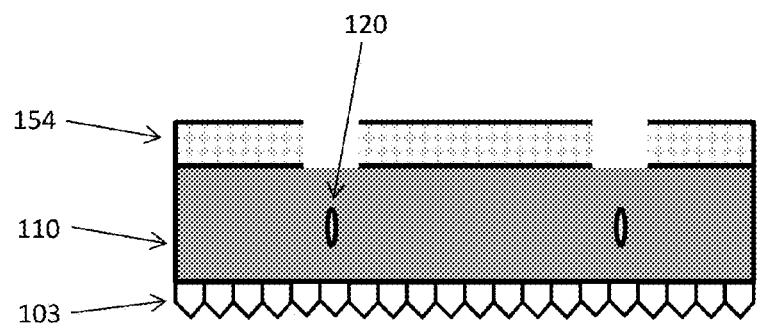

Another embodiment provides a method of dicing semiconductor devices is shown in FIGS. 8A-8C. A substrate 110 according to an embodiment includes depositing a Bragg reflector 154 (e.g., a DBR) on a bottom side 110B of the substrate 110 opposite of a top side 110A. The Bragg reflector 154 includes a first dielectric layer 154A having a first index of refraction and a second dielectric layer 154B having a second index of refraction.

The Bragg reflector 154 is then selectively removed in some locations 151, as shown in FIG. 8B. The step of selectively removing the Bragg reflector may comprise etching grooves 151 through the Bragg reflector to expose the bottom side 110A of the substrate 110 and to define a pattern of individual LED dies 102 on the bottom side of the substrate.

This removal can be achieved by any method known in the art, including laser ablation, or by applying and patterning and temporary mask, such as photoresist, over the Bragg reflector, and wet or dry etching exposed portions of the Bragg reflector in the temporary mask and then removing the temporary mask. Alternatively, the DBR can be selectively deposited, such as through a shadow mask. In this embodiment, selectively removing portions of the Bragg reflector includes selectively depositing the Bragg reflector through a shadow mask and removing the shadow mask to selectively remove portions of the Bragg reflector deposited on the mask.

Figure 9A:
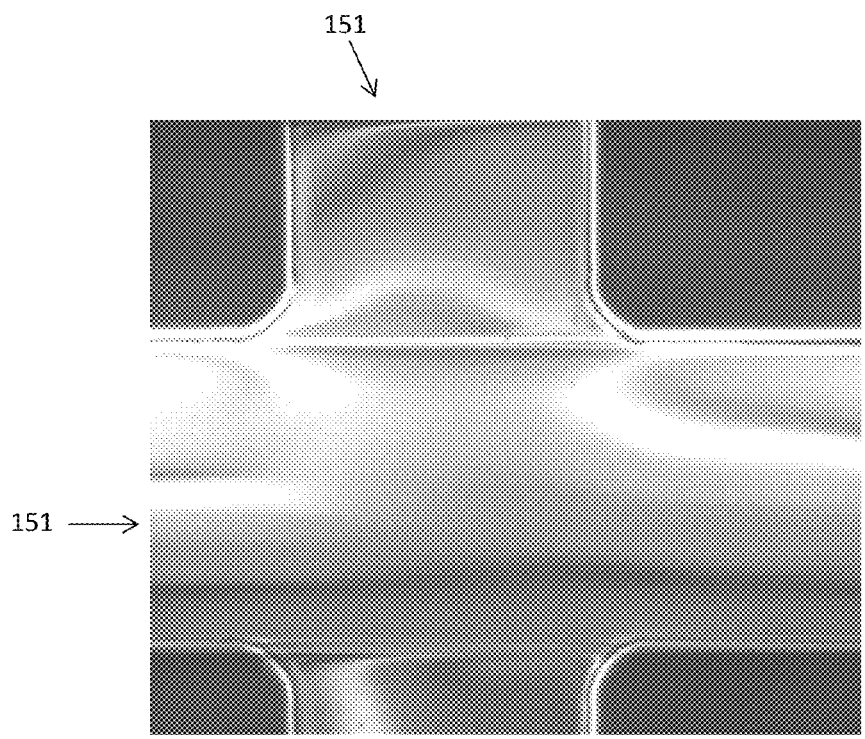
FIGS. 9A-B are SEM micrographs of a DBR layer on a wafer, where the DBR has been selectively removed by dry etching.
Figure 9B:
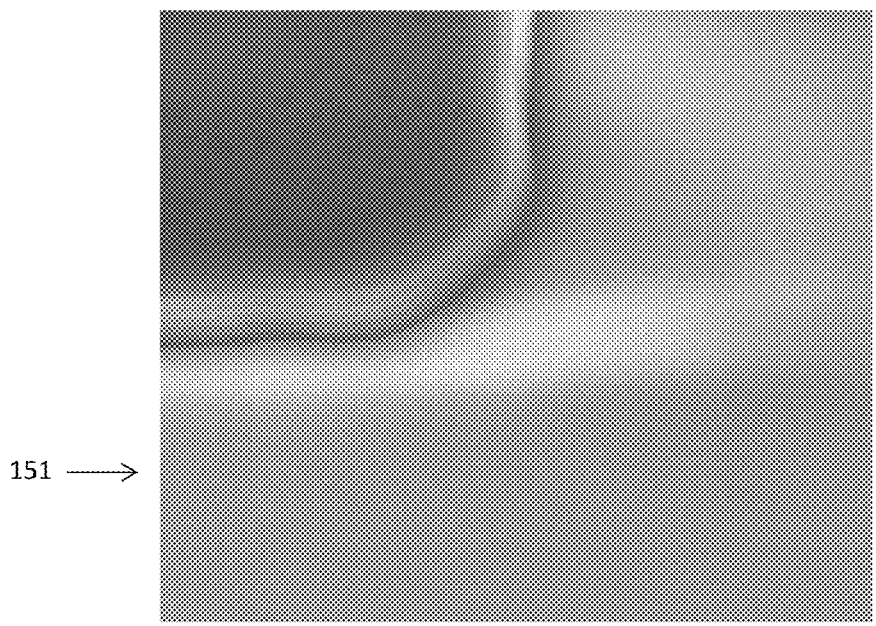

The Bragg reflector may be etched using any suitable dry or web etching chemistry, such as a chlorine based chemistry. For example, a temporary mask may be applied over a DRB having a stack of $TiO_2/SiO_2$ layers and then the stack may be etched using a plasma etcher with a 275 Watt RF power, 700 Watts bias, 6 mTorr pressure, and 40 sccm of chlorine gas. This is sufficient to etch the 6 pairs of $TiO_2/SiO_2$ layer in unmasked areas, without etching the sapphire substrate 110. The temporary mask is removed after etching by standard techniques, such as solvent dissolution. The SEM micrographs in FIGS. 9A and 9B show an etched DBR 154 before stealth scribing.

Figure 10:
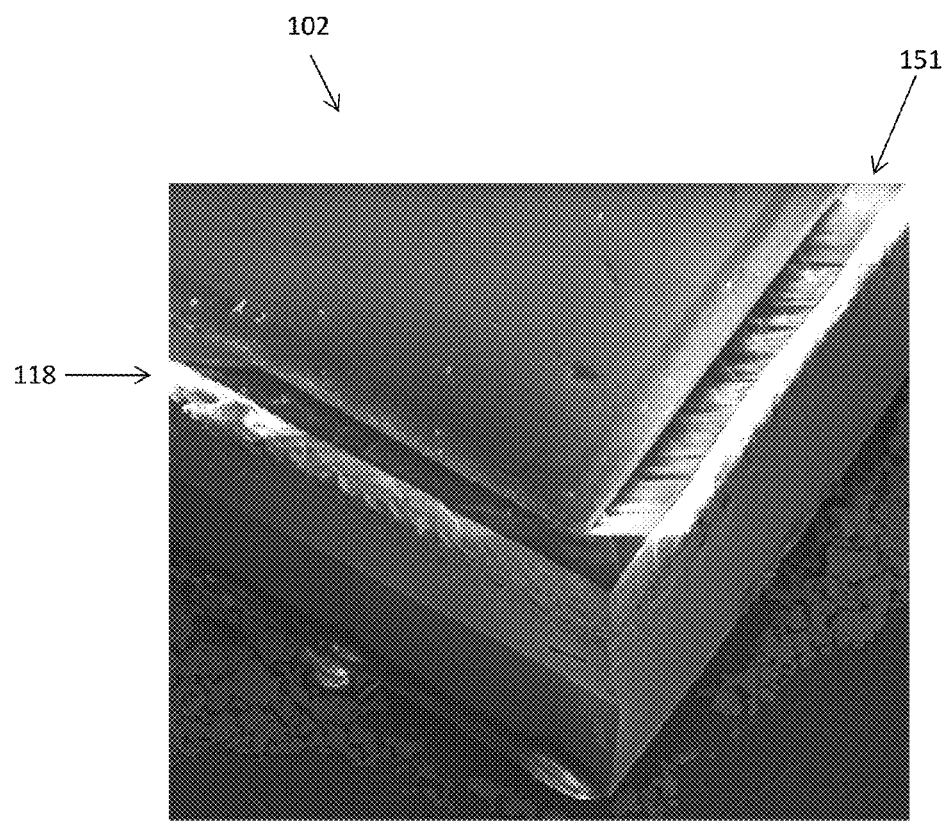
FIG. 10 is an SEM micrograph of the backside of a die where a DBR is selectively removed, laser placed defects are located under the areas where the DBR has been removed, and the die is singulated by mechanical force.

The selective removal of the DBR 154 provides a way for a laser with wavelength 532 nm to penetrate and focus in the interior of the substrate 110 (e.g., sapphire wafer), as shown in FIG. 8C. This creates a pattern of defects 120 in the substrate 110, similar to the pattern 122 shown in FIG. 5B. Specifically, the pattern of defects 120 in the substrate 110 may be generated with a laser beam provided onto the bottom side of the substrate through the grooves 151 in the DBR. FIG. 10 shows a die that is singulated by the process of FIGS. 8A-8C.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of dicing semiconductor devices from a substrate, comprising:
    forming a Bragg reflector over a bottom side of the substrate, wherein the bottom side is opposite of a top side and the Bragg reflector comprises a first layer of dielectric material having a first index of refraction and a second dielectric material having a second index of refraction different from the first index of refraction;
    forming a plurality of LED layers over the top side of the substrate, wherein the semiconductor devices comprise LED dice;
    generating a pattern of defects in the substrate with a laser beam from the bottom side of the substrate; and
    applying pressure to the substrate to dice the substrate along the pattern of defects.

2. The method of claim 1, further comprising selectively removing portions of the Bragg reflector to expose portions of the bottom side of the substrate.

3. The method of claim 1, wherein generating the pattern of defects comprises generating the pattern of defects in the substrate with a laser beam through the Bragg reflector.

4. The method of claim 3, wherein a peak wavelength of the laser beam is transmitted through the first and second dielectric layers which are transparent to the peak wavelength of the laser beam.

5. The method of claim 1, wherein the substrate comprises sapphire, the LED layers comprise III-nitride semiconductor layers, and the Bragg reflector comprises a stack of layers comprising at least two $TiO_2$, $SiO_2$, $Si_3N_4$, $Ta_2O_5$, $HfO_2$, $Al_2O_3$, $ZrO_2$ or $ZnO$.

6. The method of claim 5, wherein the LED layers comprise III-nitride nanowire based LED layers formed over GaN buffer layer located on the top side of the sapphire substrate, and the Bragg reflector comprises a stack of alternating layers of $TiO_2$ and $SiO_2$ deposited by evaporation, and the Bragg reflector has a thicknesses of $t=\lambda/4n$, where $\lambda$ is the wavelength that is desired to be reflected and n is the index of refraction of material comprising the Bragg reflector.

* * * * *